(12) United States Patent
Lu et al.

(10) Patent No.: US 10,354,954 B2
(45) Date of Patent: *Jul. 16, 2019

(54) COPPER ETCHING INTEGRATION SCHEME

(71) Applicant: Taiwan Semiconductor Manufacturing Co., Ltd., Hsin-Chu (TW)

(72) Inventors: Chih-Wei Lu, Hsinchu (TW); Chung-Ju Lee, Hsinchu (TW); Hsiang-Huan Lee, Jhudong Township (TW); Tien-I Bao, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,039

(22) Filed: Jun. 25, 2018

(65) Prior Publication Data

US 2018/0301416 A1    Oct. 18, 2018

Related U.S. Application Data

(63) Continuation of application No. 15/463,617, filed on Mar. 20, 2017, now Pat. No. 10,020,259, which is a
(Continued)

(51) Int. Cl.
*H01L 21/00* (2006.01)
*H01L 23/528* (2006.01)
(Continued)

(52) U.S. Cl.
CPC .... *H01L 23/5283* (2013.01); *H01L 21/31053* (2013.01); *H01L 21/32139* (2013.01); *H01L 21/7682* (2013.01); *H01L 21/76852* (2013.01); *H01L 21/76885* (2013.01); *H01L 21/76892* (2013.01); *H01L 23/5226* (2013.01); *H01L 23/5329* (2013.01); *H01L 23/5384* (2013.01); *H01L 23/5386* (2013.01);
(Continued)

(58) Field of Classification Search
None
See application file for complete search history.

(56) References Cited

U.S. PATENT DOCUMENTS 5,726,498 A    3/1998 Licata et al.
5,960,311 A    9/1999 Singh et al.
(Continued)

OTHER PUBLICATIONS

Non-Final Office Action dated Jul. 18, 2013 for U.S. Appl. No. 13/676,260.
(Continued)

*Primary Examiner* — Reema Patel
(74) *Attorney, Agent, or Firm* — Eschweiler & Potashnik, LLC

(57) ABSTRACT

The present disclosure, in some embodiments, relates to an interconnect structure. The interconnect structure has a metal body disposed over a substrate, and a metal projection protruding outward from an upper surface of the metal body. A dielectric layer is disposed over the substrate and surrounds the metal body and the metal projection. A barrier layer separates the metal body and the metal projection from the dielectric layer.

20 Claims, 5 Drawing Sheets

Related U.S. Application Data continuation of application No. 15/153,967, filed on May 13, 2016, now Pat. No. 9,633,949, which is a continuation of application No. 14/218,060, filed on Mar. 18, 2014, now Pat. No. 9,373,586, which is a continuation-in-part of application No. 13/676,260, filed on Nov. 14, 2012, now Pat. No. 8,728,936.

(51) Int. Cl.

| | | |
|---|---|---|
| *H01L 23/538* | (2006.01) | |
| *H01L 23/532* | (2006.01) | |
| *H01L 21/768* | (2006.01) | |
| *H01L 29/06* | (2006.01) | |
| *H01L 21/3105* | (2006.01) | |
| *H01L 21/3213* | (2006.01) | |
| *H01L 23/522* | (2006.01) | |

(52) U.S. Cl.
CPC .. *H01L 23/53214* (2013.01); *H01L 23/53228* (2013.01); *H01L 23/53233* (2013.01); *H01L 23/53238* (2013.01); *H01L 23/53257* (2013.01); *H01L 23/53266* (2013.01); *H01L 23/53295* (2013.01); *H01L 29/0649* (2013.01); *H01L 23/5222* (2013.01); *H01L 23/53223* (2013.01); *H01L 2924/0002* (2013.01)

(56) References Cited

U.S. PATENT DOCUMENTS

| | | | |
|---|---|---|---|
| 6,143,641 A | 11/2000 | Kitch | |
| 6,214,719 B1 | 4/2001 | Nag | |
| 6,291,331 B1 | 9/2001 | Wang et al. | |
| 6,426,267 B2 * | 7/2002 | Liou | H01F 41/041 |
| | | | 257/E21.022 |
| 6,875,693 B1 | 4/2005 | May et al. | |
| 7,554,176 B2 | 6/2009 | Naito | |
| 7,612,453 B2 | 11/2009 | Usami | |
| 8,728,936 B1 * | 5/2014 | Lu | H01L 21/486 |
| | | | 257/E21.582 |
| 9,373,586 B2 * | 6/2016 | Lu | H01L 23/53295 |
| 9,633,949 B2 * | 4/2017 | Lu | H01L 23/53295 |
| 10,020,259 B2 * | 7/2018 | Lu | H01L 23/5384 |
| 2004/0121583 A1 | 6/2004 | Bao et al. | |
| 2004/0161923 A1 | 8/2004 | Bae et al. | |
| 2004/0227243 A1 | 11/2004 | Perng | |
| 2004/0238964 A1 | 12/2004 | Kawano et al. | |
| 2005/0142857 A1 | 6/2005 | Lee | |
| 2006/0027924 A1 | 2/2006 | Chen et al. | |
| 2006/0081987 A1 * | 4/2006 | Kobayashi | H01L 21/76801 |
| | | | 257/751 |
| 2006/0151881 A1 * | 7/2006 | Yamada | H01L 21/6835 |
| | | | 257/758 |
| 2008/0122103 A1 | 5/2008 | Bonilla et al. | |
| 2008/0124917 A1 | 5/2008 | Oh et al. | |
| 2009/0305502 A1 | 12/2009 | Lee et al. | |
| 2011/0147059 A1 | 6/2011 | Ma et al. | |

OTHER PUBLICATIONS

Notice of Allowance dated Nov. 27, 2013 for U.S. Appl. No. 13/676,260.
Non-Final Office Action dated Aug. 5, 2015 for U.S. Appl. No. 14/218,060.
Final Office Action dated Dec. 4, 2015 for U.S. Appl. No. 14/218,060.
Notice of Allowance dated Feb. 22, 2016 for U.S. Appl. No. 14/218,060.
Non-Final Office Action dated Jul. 19, 2016 for U.S. Appl. No. 15/153,967.
Notice of Allowance dated Dec. 12, 2016 for U.S. Appl. No. 15/153,967.
Non-Final Office Action dated Jun. 29, 2017 for U.S. Appl. No. 15/463,617.
Final Office Action dated Dec. 18, 2017 for U.S. Appl. No. 15/463,617.
Notice of Allowance dated Mar. 12, 2018 for U.S. Appl. No. 15/463,617.

* cited by examiner

COPPER ETCHING INTEGRATION SCHEME

REFERENCE TO RELATED APPLICATIONS

This Application is a Continuation of U.S. application Ser. No. 15/463,617, filed on Mar. 20, 2017, which is a Continuation of U.S. application Ser. No. 15/153,967, filed on May 13, 2016 (now U.S. Pat. No. 9,633,949 issued on Apr. 25, 2017), which is a Continuation of U.S. application Ser. No. 14/218,060, filed on Mar. 18, 2014 (now U.S. Pat. No. 9,373,586 issued on Jun. 21, 2016), which is a Continuation-in-Part of U.S. application Ser. No. 13/676,260, filed on Nov. 14, 2012 (now U.S. Pat. No. 8,728,936 issued on May 20, 2014). The contents of the above-referenced applications are hereby incorporated by reference in their entirety.

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

DETAILED DESCRIPTION

Figure 1A:
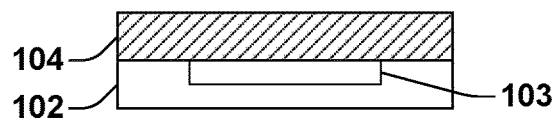
FIGS. 1A-1M are partial cross sectional views illustrating steps of one embodiment of forming an interconnect structure in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor devices are manufactured or fabricated on semiconductor wafers using a number of different processing steps to create transistor and interconnection elements. To electrically connect transistor terminals associated with the semiconductor wafer, conductive (e.g., metal) wires, conductive vias, and the like are formed in dielectric materials as part of the semiconductor device. The conductive wires and vias couple electrical signals and power between transistors, internal circuit of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and etching steps can be performed to form a pattern of recessed areas in a dielectric layer, such as a low-k dielectric layer, on a semiconductor wafer that serve as trenches and via holes for the interconnections. A deposition process may then be performed to deposit a metal layer over the semiconductor wafer thereby depositing metal both in the trenches and via holes and also on the non-recessed areas of the semiconductor wafer.

Increasingly, low-k dielectric layers are used to reduce signal delay and power loss effects as integrated circuit devices are scaled down. One way this has been accomplished has been to introduce porosity or dopants into the dielectric insulating layer.

As a result, the need for lower dielectric constant materials has resulted in the development of several different types of organic and inorganic low-k materials. In particular, incorporation of low-k materials with dielectric constants less than about 3.0 has become standard practice as semiconductor feature sizes have diminished to less than 0.13 microns. As feature sizes decrease below 0.13 microns, for example to 65 nm and below, materials with dielectric constants less than about 2.5 are often used. Several different organic and inorganic low-k materials have been developed and proposed for use in semiconductor devices as insulating material having dielectric constants between about 2.2 and about 3.0.

Low-k dielectric materials, however, are susceptible to damage from the etching processes because they are softer, less chemically stable or more porous, or any combination of these factors. The plasma damage can manifest itself in higher leakage currents, lower breakdown voltages, and changes in the dielectric constant associated with the low-k dielectric material.

There is, therefore, a need in the integrated circuit manufacturing art to develop a manufacturing process whereby interconnect structures may be formed without encountering the various problems presented by porous low-K dielectric layers to improve integrated circuit device yield, performance, and reliability.

Accordingly, the present disclosure is directed to methods of fabrication of an interconnect structure. The methods provide a process for defining an interconnect structure that eliminates low-k dielectric damage caused during etching processes. The process provides the further advantage of removing etch stop or NFARC (nitrogen-free anti-reflective coating) layers, making the process more cost effective.

FIGS. 1A-1M illustrate a plurality of partial cross section diagrams illustrating one embodiment of a method of forming an interconnect structure at stages in the manufacturing process according to the disclosure. Referring to FIG. 1A, a semiconductor substrate 102 having a conductive region 103 is provided. Substrate 102 is understood to include a semiconductor wafer or substrate, comprised of a semiconducting material such as silicon or germanium, or a silicon on insulator structure (SOI). Semiconductor structure can further include one or more conductive layers (such as metal or silicon) and/or insulating layers, and one or more active or passive devices formed in or over the substrate, or the like, for example, a display substrate such as a liquid crystal display (LCD), plasma display, electro-luminescence (EL) lamp display, or a light emitting diode (LED) substrate.

Overlying substrate 102 and covering conductive region 103 is a sacrificial layer 104. Sacrificial layer 104 comprises a homopolymer or copolymer. In one embodiment, sacrificial layer 104 comprises one or more of polyimide or P(neopentyl methacrylate-co-theylene glycol dimethacrylate copolymer (P(npMAco-EGDA). Sacrificial layer 104 is deposited by one or more of chemical vapor deposition (CVD) or spin-on coating processes. The thickness of the sacrificial layer will be in a range of from about 10000 Å (angstroms) to about 100 Å.

Figure 1B:
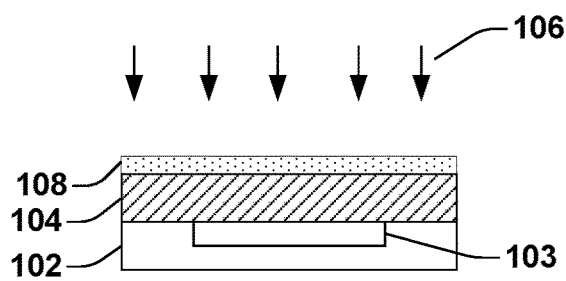

A dielectric hard mask layer 108 is then deposited 106 by, for example, a CVD process, as illustrated in FIG. 1B. The dielectric hard mask layer 108 is used to pattern the sacrificial layer 104 in a subsequent photolithographic process. In some embodiments, the dielectric hard mask layer 108 comprises a material such as silicon-oxide, silicon-nitride, silicon-oxynitride, and silicon-carbide. The dielectric hard mask layer 108 will have a thickness of from about 1000 Å to about 10 Å.

Figure 1C:
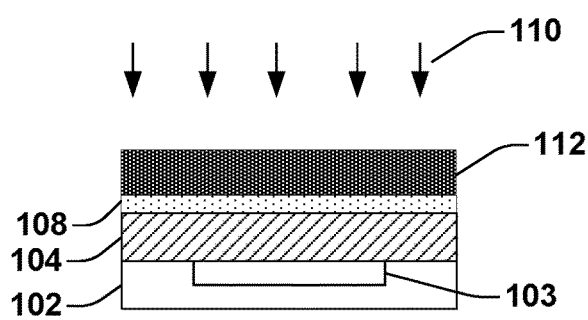
Figure 1D:
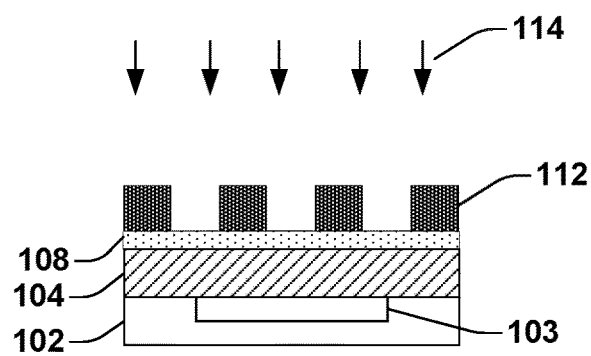

Following deposition of the hard mask layer 108, in one embodiment, a photoresist film 112 is formed by process 110 over the hard mask layer 108, as illustrated in FIG. 1C. Conventional photoresist materials may be used. The photoresist film 112 can be a carbon-containing, organic material. Various photoresists having various thicknesses can be utilized. Photo resist patterning and etching 114 are performed in FIG. 1D.

Figure 1E:
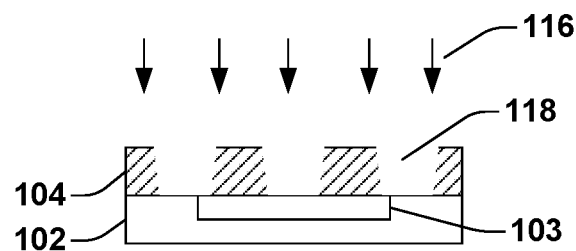

Hard mask 108 patterning and first etching process 116 through the hard mask layer 108 and into the sacrificial layer 104 are then performed to remove a portion of sacrificial layer 104 and form a first feature defined by an opening 118 in the sacrificial layer 104, as shown in FIG. 1E. In one embodiment, first feature comprises a trench.

Figure 1F:
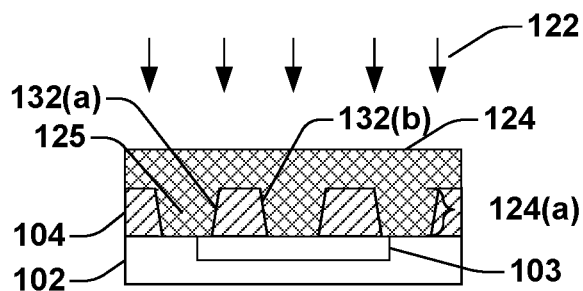

In FIG. 1F, a metal layer 124 is deposited 122 over first feature and filling opening 118 in sacrificial layer 104 to form a metal body 125 therein. Metal body 125 is defined by a lower portion 124(a) of the metal layer 124. Metal body 125 includes angled opposing sidewalls. In some embodiments, the metal body 125 comprises a metal wire layer configured to provide for a lateral interconnection (i.e., an interconnection parallel to the surface of the semiconductor substrate 102). In one embodiment, the metal layer 124 can be formed from elements such as aluminum (Al), tungsten (W), copper (Cu), copper manganese (CuMn), copper-titanium (CuTi), copper vanadium (CuV), copper chromium (CuCr), or copper-niobium (CuNb), and the like. Metal layer 124 can be formed using, for example, a plasma vapor deposition technique, among others. Metal layer 124 can be deposited at a thickness, in one embodiment, of from about 100 Å (Angstroms) to about 20,000 Å.

Figure 1G:
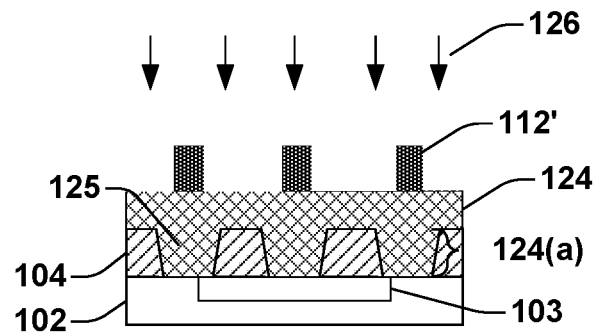
Figure 1H:
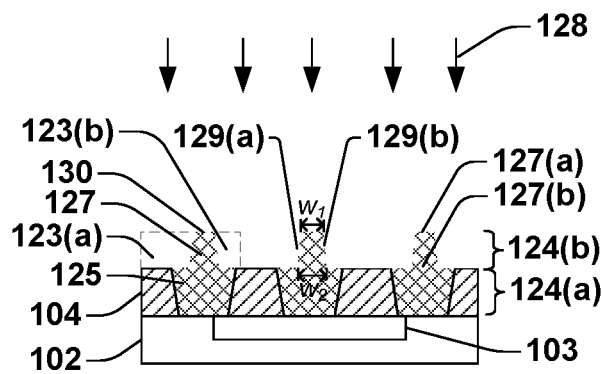

A photoresist film 112' is formed over the metal layer 124 and patterned 126 by conventional techniques, as shown in FIG. 1G. A second etch 128 is performed to pattern and etch an upper portion 124(b) of the metal layer 124 to form a second feature having first recesses 123(a), 123(b) and defined by a vertical projection 127 extending from the metal body 125, as illustrated in FIG. 1H.

The vertical projection 127 includes angled opposing sidewalls, 129(a) and 129(b), and upper surface 130. In some embodiments, the angled opposing sidewalls, 129(a) and 129(b), are tapered such that the vertical projection 127 has a narrower top surface 127(a) and wider bottom surface 127(b) (i.e., $w_1<w_2$). In some embodiments, the vertical projection 127 comprises a metal via configured to provide for a vertical interconnection between an underlying metal body and an overlying metal body.

Figure 1I:
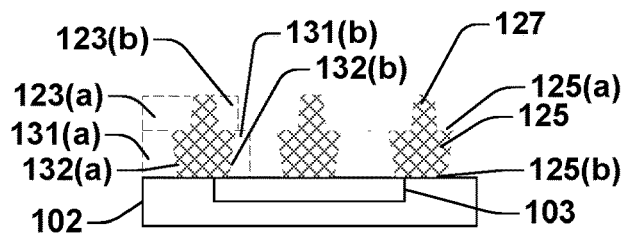
Figure 1J:
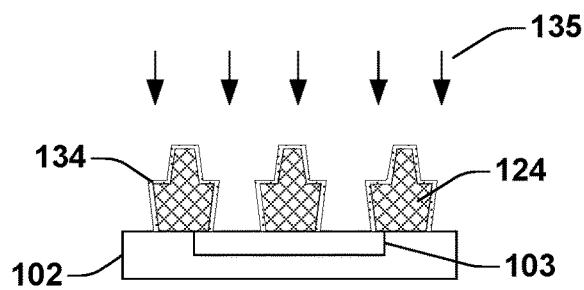

In FIG. 1I, sacrificial layer 104 is removed by one or more of, for example, etching, wet stripping, annealing, UV or IR radiation techniques (not shown). Removal of the sacrificial layer 104 exposes angled opposing sidewalls 132(a), 132(b) of metal body 125 and forms second recesses 131(a), 131(b). Angled opposing sidewalls 132(a), 132(b) taper such that metal body 125 has a wider top surface 125(a) and narrower bottom surface 125(b).

In one embodiment, a barrier layer 134 is formed overlying and encompassing metal body 125 and vertical projection 127 and disposed between dielectric material 136 (FIG. 1K) and metal layer 124. By encompassing metal body 125 and vertical projection 127, barrier layer 134 is continuous. Barrier layer 134 is formed by depositing a dielectric material, for example, silicon-nitride and silicon-carbide. In one embodiment, barrier layer 134 is formed by depositing a metal, for example, TiN, TaN, Co, WN, TiSiN, TaSiN, or combinations thereof. In another embodiment, an annealing 135 is performed at a temperature of about greater than 200° C., such that barrier layer 134 is self-forming, as illustrated FIG. 1J. The thickness of the barrier layer 134 can be, in one embodiment, from about 1 Å (Angstrom) to about 300 Å.

Figure 1K:
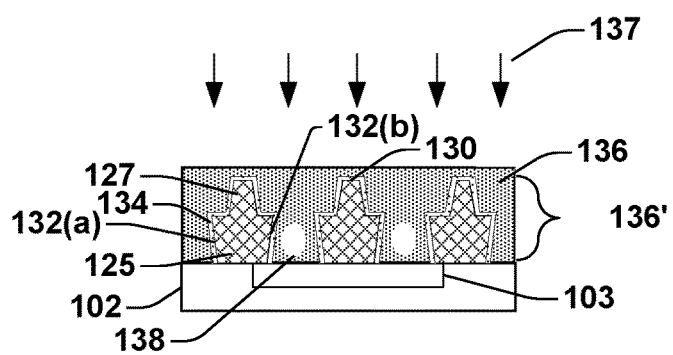

In FIG. 1K, low-k dielectric material 136 is deposited by process 137 to fill first 123(a), 123(b) and second 131(a), 131(b) recesses and overlying the upper surface 130 of the vertical projection 127 to form a dielectric region 136'. Low-k dielectric material 136 thus encapsulates vertical projection 127 and metal body 125. The low-k dielectric includes dielectrics with k less than about 3. Such dielectrics include, for example, carbon-doped silicon dioxide, also referred to as organosilicate glass (OSG) and carbon-oxide. Low-k materials may also include borophosphosilicate glass (BPSG), borosilicate glass (BSG), and phosphosilicate glass (PSG), among others. The dielectric layer 136 may be formed using, for example, tetraethyl orthosilicate (TEOS), chemical vapor deposition (CVD), plasma enhanced CVD (PECVD), low pressure CVD (LPCVD), or spin-on coating techniques. The thickness of the low-k dielectric will be, in one embodiment, from about 100 Å to about 20000 Å.

Figure 1L:
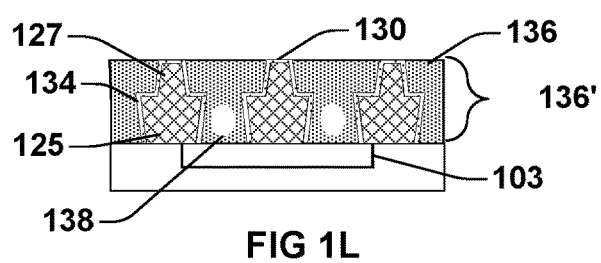

In the embodiment illustrated in FIG. 1K, at least one air gap 138 is formed within the dielectric material 136. The air gap 138 is disposed in the dielectric region 136' between angled sidewalls 132(a), 132(b) of adjacent metal bodies 125. Air gap 138 can be self-forming during deposition of the low-k material 136. In one embodiment, the size of the air gap can be from about 0 Å to about 20000 Å. It is contemplated, however, that the size of the air gap can be controlled by the low-k material 136 deposition process. A chemical mechanical polishing (CMP) process can then be performed to remove excess dielectric layer 136 and expose upper surface 130 of vertical projection 127, as illustrated in FIG. 1L.

Figure 1M:
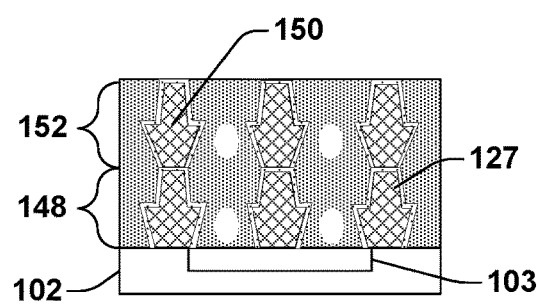

Following CMP process, the method can be repeated to form an additional metal layer 150 of an interconnect structure 152 overlying vertical projection 127 and electrically coupled to the vertical projection 127, as illustrated in FIG. 1M, so as to form an integrated circuit of at least two adjacent interconnect structures, 148 and 152.

Figure 2:
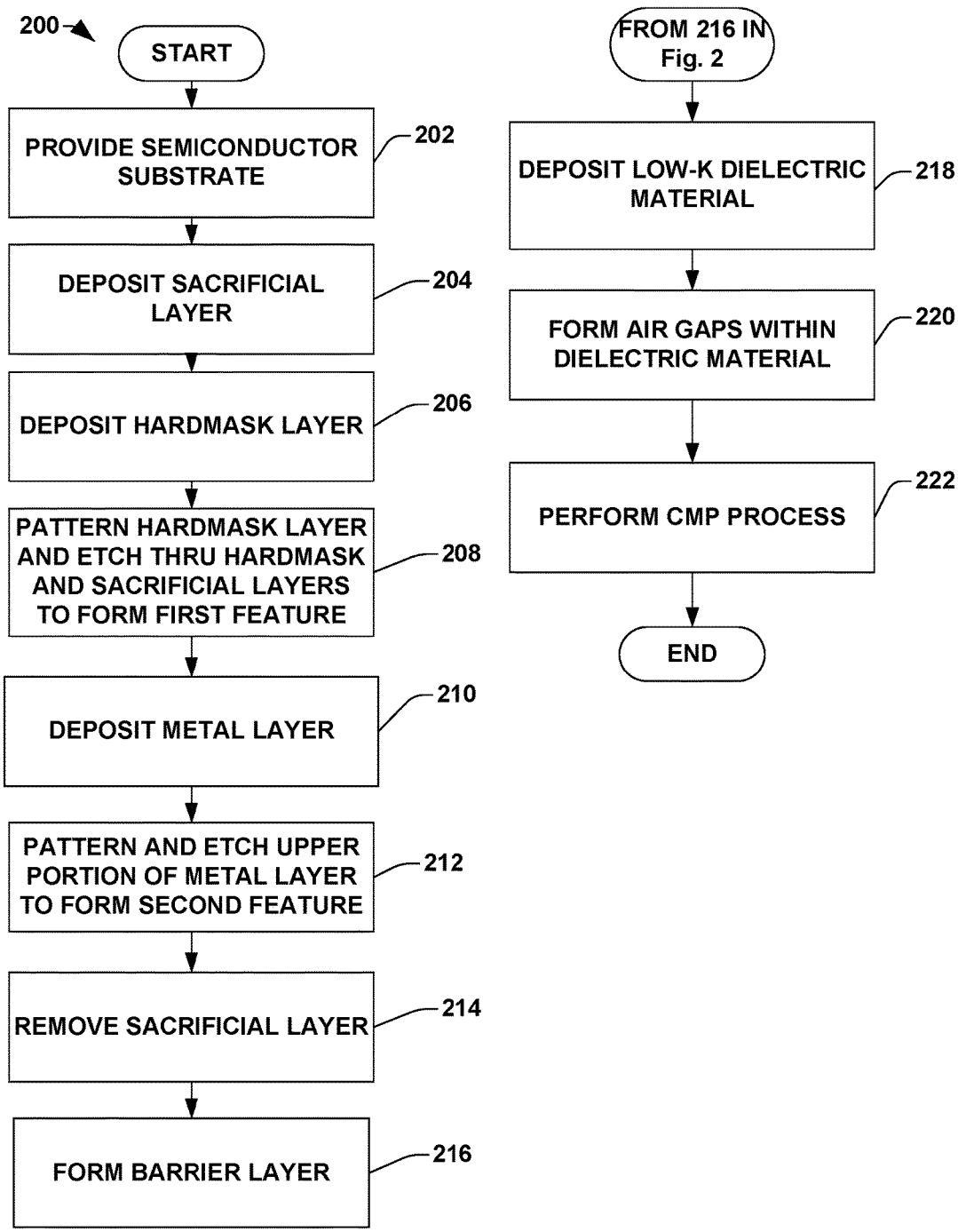
FIG. 2 illustrates a flow diagram of some embodiments of a method for the fabrication of an interconnect structure in accordance with the disclosure.

FIG. 2 illustrates a flow diagram of some embodiments of a method 200 for formation of a semiconductor structure according to an embodiment of the present disclosure. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 202 a semiconductor substrate is provided. A sacrificial layer is then formed over the substrate at step 204.

At step 206, a hard mask layer is deposited overlying the sacrificial layer.

At step 208, a first feature is formed by patterning and etching through hard mask and sacrificial layer to form an opening in the sacrificial layer.

At step 210, a metal layer is deposited overlying first feature and filling the feature opening.

At step 212, an upper portion of the metal layer is patterned and etched to form a second feature.

At step 214, sacrificial layer is removed.

At step 216, a barrier layer is formed by CVD, PVD, MOCVD or ALD, or barrier layer can be self-formed by annealing.

At step 218, a low-k dielectric material is deposited to fill recesses and encompass metal body and vertical projection.

At step 220, at least one air gap is formed in the low-k dielectric material. The air gap is disposed in the dielectric region between adjacent interconnect structures.

At step 222, a CMP process is performed to remove excess dielectric layer and expose a top surface of the vertical projection. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to method for forming a conductive interconnect structure, and a related apparatus.

In some embodiments, the present disclosure relates to a method for forming an interconnect structure. The method comprises forming an opening within a sacrificial layer that is over a substrate, and forming a conductive material within the opening and over the sacrificial layer. The conductive material within the opening defines a conductive body. The method further comprises patterning the conductive material to define a conductive projection extending outward from the conductive body, and removing the sacrificial layer. The method further comprises forming a dielectric material surrounding the conductive body and the conductive projection.

In other embodiments, the present disclosure relates to a method for forming an interconnect structure. The method comprises etching one or more sacrificial materials over a substrate to define an opening extending through the one or more sacrificial materials. The method further comprises forming metal within the opening and over the one or more sacrificial materials. The metal within the opening defines a metal body. The method further comprises selectively etching the metal to define a metal projection extending from the metal body. The metal projection is set back from sidewalls of the metal body. The method further comprises removing the one or more sacrificial materials to expose opposing sidewalls of the metal body, and forming a dielectric material surrounding the metal body and the metal projection.

In yet other embodiments, the present disclosure relates to an integrated chip. The integrated chip comprises a copper body over a substrate, and a copper projection disposed on and in contact with the copper body. The copper projection has angled sidewalls that cause a width of the copper projection to decrease as a distance from the copper body increases. The copper body laterally extends past the angled sidewalls of the copper projection.

What is claimed is:

1. An interconnect structure, comprising:
a metal body disposed over a substrate;
a metal projection having sidewalls that protrude outward from an upper surface of the metal body, wherein the sidewalls are directly over the metal body and wherein the metal body and the metal projection comprise a same type of metal that continuously extends from a bottom of the metal body to a top of the metal projection;
a dielectric layer disposed over the substrate and surrounding the metal body and the metal projection; and
a barrier layer separating the metal body and the metal projection from the dielectric layer, wherein the barrier layer has a first sidewall and a second sidewall coupled to opposing ends of a horizontal segment, wherein the first sidewall is oriented at a non-zero angle with respect to the second sidewall.

2. The interconnect structure of claim 1, further comprising:
an additional metal body disposed over the metal projection and laterally extending past outermost sidewalls of the metal projection, wherein the barrier layer continuously extends from the upper surface of the metal body to directly contact the top of the metal projection and a bottom of the additional metal body.

3. The interconnect structure of claim 2, further comprising:
an additional dielectric layer disposed over the dielectric layer and surrounding the additional metal body, wherein the dielectric layer has one or more surfaces defining a first cavity filled with a first gas and the additional dielectric layer has one or more surfaces defining a second cavity directly over the first cavity and filled with a second gas.

4. The interconnect structure of claim 1, wherein the dielectric layer has one or more surfaces defining a first cavity arranged completely below the upper surface of the metal body and filled with a first gas.

5. The interconnect structure of claim 1, wherein the dielectric layer comprises a dielectric constant of less than about 3.

6. The interconnect structure of claim 1, wherein the same type of metal is copper.

7. The interconnect structure of claim 1, wherein the dielectric layer continuously extends between a bottommost surface that is substantially co-planar with the bottom of the metal body and a topmost surface that is substantially co-planar with a top of the barrier layer.

8. The interconnect structure of claim 1, wherein an uppermost surface of the barrier layer is substantially co-planar or level with an uppermost surface of the metal projection, and a bottommost surface of the barrier layer is substantially co-planar or level with a bottommost surface of the metal body.

9. The interconnect structure of claim 1, wherein the dielectric layer has a topmost surface that is substantially co-planar or level with an uppermost surface of the barrier layer.

10. An integrated chip, comprising:
an interconnect structure disposed over a substrate, wherein the interconnect structure comprises a conductive material having a first upper surface between first sidewalls and second sidewalls and a second upper surface above the first upper surface and between the second sidewalls;
a dielectric material disposed over the substrate and surrounding the interconnect structure; and
a barrier layer continuously extending between the first sidewalls and the second sidewalls, wherein the barrier layer has a bottommost surface that is directly coupled to an interior sidewall physically contacting a first one of the first sidewalls and wherein the barrier layer has a first sidewall and a second sidewall coupled to opposing ends of a horizontally extending segment, wherein the first sidewall is oriented at a non-zero angle with respect to the second sidewall.

11. The integrated chip of claim 10, further comprising:
an additional interconnect structure disposed over the interconnect structure, wherein an additional dielectric material surrounds the additional interconnect structure and contacts a top of the dielectric material.

12. The integrated chip of claim 11,
wherein the conductive material continuously extends between the first upper surface and the second upper surface; and
wherein the barrier layer has a thickness that is smaller than a height of the second sidewalls of the conductive material.

13. The integrated chip of claim 10, wherein the barrier layer extends along the first sidewalls and the second sidewalls.

14. The integrated chip of claim 13, wherein the barrier layer has a substantially constant thickness along the first sidewalls, the second sidewalls, and between the first sidewalls and the second sidewalls.

15. The integrated chip of claim 10, further comprising:
an additional interconnect structure disposed over the interconnect structure, wherein the barrier layer continuously extends from the first upper surface of the conductive material to directly contact a bottom of the additional interconnect structure.

16. The integrated chip of claim 10, wherein the interconnect structure comprises:
a metal wire disposed over the substrate; and
a via extending outward from a top surface of the metal wire and having a width that is less than a width of the metal wire.

17. An integrated chip, comprising:
an interconnect structure disposed over a substrate, wherein the interconnect structure comprises a conductive material having a first surface coupled between a first sidewall of the conductive material and a second sidewall of the conductive material;
a dielectric material disposed over the substrate and surrounding the interconnect structure; and
a barrier layer having a horizontally extending segment contacting the first surface, the horizontally extending segment arranged vertically and laterally between a first sidewall of the barrier layer and a second sidewall of the barrier layer, wherein the first sidewall of the barrier layer and the second sidewall of the barrier layer are oriented at different angles with respect to a line that is normal to an upper surface of the horizontally extending segment, and wherein the barrier layer has a bottommost surface that is directly coupled to an interior sidewall of the barrier layer physically contacting the conductive material.

18. The integrated chip of claim 17, wherein the interconnect structure comprises:
metal wire disposed over the substrate; and
a via extending outward from a top of the metal wire and having a width that is less than a width of the metal wire.

19. The integrated chip of claim 17,
wherein the first surface is a first upper surface of the conductive material; and
wherein the second sidewall of the conductive material continuously extends from the first upper surface of the conductive material to a top of the interconnect structure.

20. The integrated chip of claim 19, wherein the top of the interconnect structure directly contacts a lower surface of the barrier layer.

* * * * *